(12) United States Patent
Azdasht

(10) Patent No.: US 8,087,163 B2
(45) Date of Patent: Jan. 3, 2012

(54) METHOD OF MANUFACTURING A CONTACT ARRANGEMENT BETWEEN A MICROELECTRONIC COMPONENT AND A CARRIER

(75) Inventor: Ghassem Azdasht, Berlin (DE)

(73) Assignee: Pac Tech—Packaging Technologies GmbH, Nauen (DE)

( * ) Notice: Subject to any disclaimer, the term of this patent is extended or adjusted under 35 U.S.C. 154(b) by 735 days.

(21) Appl. No.: 12/092,806

(22) PCT Filed: Nov. 17, 2006

(86) PCT No.: PCT/DE2006/002021
§ 371 (c)(1),
(2), (4) Date: Aug. 13, 2008

(87) PCT Pub. No.: WO2007/056997
PCT Pub. Date: May 24, 2007

(65) Prior Publication Data
US 2009/0032296 A1    Feb. 5, 2009

(30) Foreign Application Priority Data
Nov. 18, 2005   (DE) .......................... 10 2005 055 505

(51) Int. Cl.
*H05K 3/34*         (2006.01)
(52) U.S. Cl. ................ 29/840; 219/121.64; 228/180.21; 228/180.22; 228/180.5
(58) Field of Classification Search .................... 29/840; 228/180.21, 180.22, 180.5; 219/121.64
See application file for complete search history.

(56) References Cited

U.S. PATENT DOCUMENTS

| 5,821,494 A * | 10/1998 | Albrecht et al. ......... 219/121.64 |
| 5,828,031 A * | 10/1998 | Pattanaik ................. 219/121.63 |
| 6,523,250 B2 * | 2/2003 | Erpelding et al. ......... 29/603.04 |
| 7,239,484 B2 * | 7/2007 | Yamaguchi ................ 360/234.5 |
| 2002/0113115 A1 | 8/2002 | Satoh et al. |
| 2005/0035184 A1 | 2/2005 | Mano et al. |

FOREIGN PATENT DOCUMENTS

DE   199 01 623 A1   7/2000

OTHER PUBLICATIONS

International Search Report corresponding to PCT/DE2006/002021 under date of mailing of Mar. 28, 2007.

* cited by examiner

*Primary Examiner* — Carl Arbes
(74) *Attorney, Agent, or Firm* — Quarles & Brady LLP

(57) ABSTRACT

The invention relates to a method for manufacturing a contact arrangement (10) between a microelectronic component (11) and a carrier substrate (12) and to an assembly unit (24) manufactured by this method, whereby thermal energy required in the connecting areas is achieved by exposing the back of the component to laser energy, a mechanical connecting contact (23) is formed between opposing connecting surfaces (17, 18) of the component and the carrier substrate, and at least one electrically conducting connecting contact (22) is formed between terminal faces (13, 15) of the carrier substrate and of the component arranged at an angle to one another by t least partially melting solder material, whereby the assembly unit manufactured by this method has at least one contact arrangement.

10 Claims, 5 Drawing Sheets

METHOD OF MANUFACTURING A CONTACT ARRANGEMENT BETWEEN A MICROELECTRONIC COMPONENT AND A CARRIER

CROSS REFERENCE TO RELATED APPLICATIONS

This application represents the national stage application of International Application PCT/DE2006/002021, filed 17 Nov. 2006, which claims the benefit of German Patent Application 10 2005 055 505.5, filed 18 Nov. 2005, which is incorporated herein by reference in its entirety for all purposes.

The invention relates to a method for manufacturing a contact arrangement between a microelectronic component and a carrier substrate as well as an assembly unit manufactured by this method, whereby thermal energy required in connecting areas is achieved by exposing the back of the component to laser energy, a mechanical connecting contact between opposing connecting surfaces of the component and the carrier substrate is formed, and at least one electrically conducting connecting contact is formed between terminal faces of the carrier substrate and the component by at least partial melting of solder material.

Methods of the aforementioned type are preferably used for contacting microelectronic components, sensors, actuators or MEMS components. With these methods, which are known as "die bonding" in general, a component is mechanically secured on a carrier substrate and is connected to printed conductor paths of the carrier substrate via a wire or solder connection. To form such a connection in one operation, it has hitherto been necessary to position the bottom side of the component with the terminal faces relative to opposing terminal faces of a carrier substrate in such a way that a contact gap is formed between the terminal faces by which an electric connection can be established by melting solder material. Since the component does not come into contact directly with the carrier substrate but instead is contacted with the carrier substrate merely via the contact surfaces, it is necessary to provide a connecting material, e.g., an adhesive material to fill a cavity formed between the component and the carrier substrate to establish an intimate mechanical connection between the component and the carrier substrate. The structural height of the component on the carrier substrate is relatively great due to the terminal faces in between, whereby a large amount of adhesive material accordingly must be used to form the mechanical connection over the cavity. After contacting the component, a visual quality control of the solder connections is impossible because they are formed in the contact gap of the terminal faces and are covered by the component and/or the adhesive material.

DE 199 01 623 A1 discloses a method and a device for forming such a contact connection described previously. In this method, a component is accommodated by a contacting device, then is exposed to laser energy on the back to achieve the required working temperature and is brought in contact with a carrier substrate. The component is accommodated and held by the contacting device by means of a vacuum. The laser energy required to achieve the working temperature is introduced into the component via a glass fiber. Thus, opposing terminal faces of the carrier substrate and the component can be contacted by the melting of solder material, a relatively large amount of adhesive material can be displaced to form a mechanical connecting contact and the component may be cured all around.

The object of the present invention is therefore to propose a method for manufacturing a contact arrangement and an assembly unit manufactured by this method, which permits a rapid, simple and inexpensive manufacturing, and with which a component has a small structural height in comparison with a carrier substrate and visible electrically conducting connecting contacts.

This object is achieved by a method having the features of Claim 1 and by an assembly unit having the features of Claim 12.

With the inventive method for manufacturing a contact arrangement between a microelectronic component and a carrier substrate, thermal energy required in the connecting area is achieved by exposing the back of the component to laser energy. This allows especially simple heating of the component and, due to the short heating time, it avoids an intolerable temperature burden for the component and the carrier substrate. In addition, a mechanical connecting contact between opposing connecting surfaces of the component and the carrier substrate is formed and at least one electrically conducting connecting contact between the terminal faces of the carrier substrate and the component is formed by at least partial melting of solder material, whereby the terminal faces are arranged at an angle to one another. The angle formed between the terminal faces is preferably 90°, but may also be 45°, 80°, 100°, 135°, or may form other angles greater than 0° and less than 180° that are suitable for such a connection. Since the terminal faces are not arranged directly opposite one another, this yields a small height for the component on the carrier substrate and the electrically conducting connecting contact is visible and can be subjected to a visual quality control. In addition, the connecting contacts can be formed especially simply with the known contacting devices, which receive the component by means of a vacuum and expose the back thereof to laser energy.

In one embodiment, a molded piece of solder material may be arranged on a terminal face before forming the contact arrangement. Then it is not necessary to supply solder material by means of a supply device during the connection operation. The at least partially melted solder material molded pieces may be connected especially well due to similar material properties and may be fused together after connecting to form a larger molded piece of solder material. Due to the surface tension, the solder material may form a spherical shape, which then subsequently solidifies.

In another embodiment, before the contact arrangement is formed, a molded piece of solder material may be arranged on the terminal face of the carrier substrate. For example, all the terminal faces of the carrier substrate may be provided with molded pieces of solder material in a process step that precedes the contacting operation, so that the contacting operation is simplified on the whole.

In another advantageous embodiment, a molded piece of solder material may be arranged on the terminal face of the component before forming the contact arrangement. Thus, before executing the connection operation, a good quality contact may be formed between the molded piece of solder material and the terminal face of the component.

It has proven to be especially advantageous if the molded piece of solder material is mechanically deformed. Then the terminal face of the carrier substrate can be wetted with solder before the connecting surfaces of the component and the carrier substrate come into mutual contact. If the molded piece of solder material protrudes above its connecting surface due to the mechanical deformation of the component, it is especially simple to allow a secure formation of an electric connecting contact.

If the mechanical connecting contact and the electrically conducting connecting contact are formed in one step, then only a single treatment of the component and the carrier substrate with thermal energy is necessary. This method may thus be performed especially rapidly.

In another embodiment of the method, a preferably parallel relative movement of the connecting surfaces between the component and the carrier substrate may take place in such a way that the terminal face of the component is contacted with a molded piece of solder material, and in a second step the connecting surfaces are contacted. Thus, before the final positioning and fastening of the component on the carrier substrate, the electrically conducting connecting contact may be formed first, and then in a second step, the mechanical connecting contact may be formed. The parallel relative movement may be performed in an oscillating manner, thus permitting especially good wetting of the terminal face of the component.

It has proven to be especially advantageous if the component and the carrier substrate are arranged at an angle relative to one another such that at a crown point a terminal face is contacted with a molded piece of solder material and/or molded pieces of solder material are contacted on a terminal face each, and then in a second step, the connecting surfaces are contacted by swiveling the component around the crown point. Due to the wetting of a terminal face with solder of a molded piece of solder material and/or due to the connection of two fused molded pieces of solder material, the electrically conducting connecting contact can be formed reliably first before the connecting surfaces are subsequently contacted.

If the mechanical connecting contact is formed by means of connecting material, which is applied to the component or to the carrier substrate, then a relatively secure mechanical connection may be formed. The use of small amounts of connecting material to form a connecting contact is sufficient because no hollow space need be bridged with the connecting material.

In one embodiment, adhesive material may be used as the connecting material. The adhesive material may be applied easily to the carrier substrate or to the connecting surface of the component. The adhesive material may be a thermoplastic polymer or an adhesive material that cures due to temperature or a combination of temperature and UV radiation. It may also be applied as a film or by dispensing or by other methods of film application.

In another embodiment, solder material may be used as the connecting material. The mechanical connecting contact may be formed with the same type of connecting material as the electrically conducting connecting contact. The number of steps preceding the method can be further reduced if the carrier substrate and the component are connectable exclusively with solder material and t en the use of adhesive material may be omitted.

The inventive assembly unit usually has at least one contact arrangement manufactured by the inventive method, whereby the assembly unit has at least one microelectronic component and a carrier substrate and one mechanical and at least one electrically conducting connecting contact are formed between the component and the carrier substrate, whereby the electrically conducting connecting contact is formed by means of solder material between terminal faces of the component and the carrier substrate arranged at an angle to one another. The assembly unit is then especially simple to manufacture in one step and has visible electrically conducting connecting contacts.

In one embodiment of the assembly unit, the mechanical connecting contact between the component and the carrier substrate may be formed by an adhesive material.

In another advantageous embodiment of the assembly unit, the mechanical connecting contact may be formed by solder material between the component and the carrier substrate.

Other advantageous embodiments of the assembly unit are derived from the description of features of the dependent claims, which refer back to the method Claim 1.

A preferred embodiment of the invention is explained in greater detail below with reference to the accompanying drawing, in which.

Figure 1:
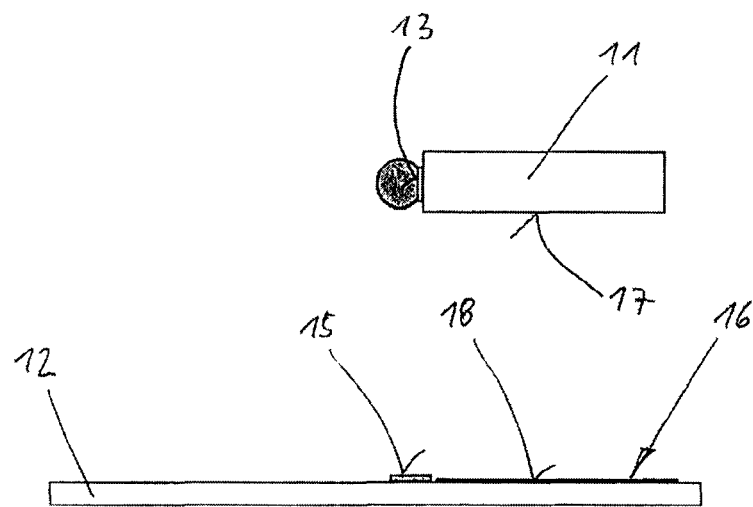
FIG. 1 shows a component and a carrier substrate before contacting in a side view.
Figure 2:
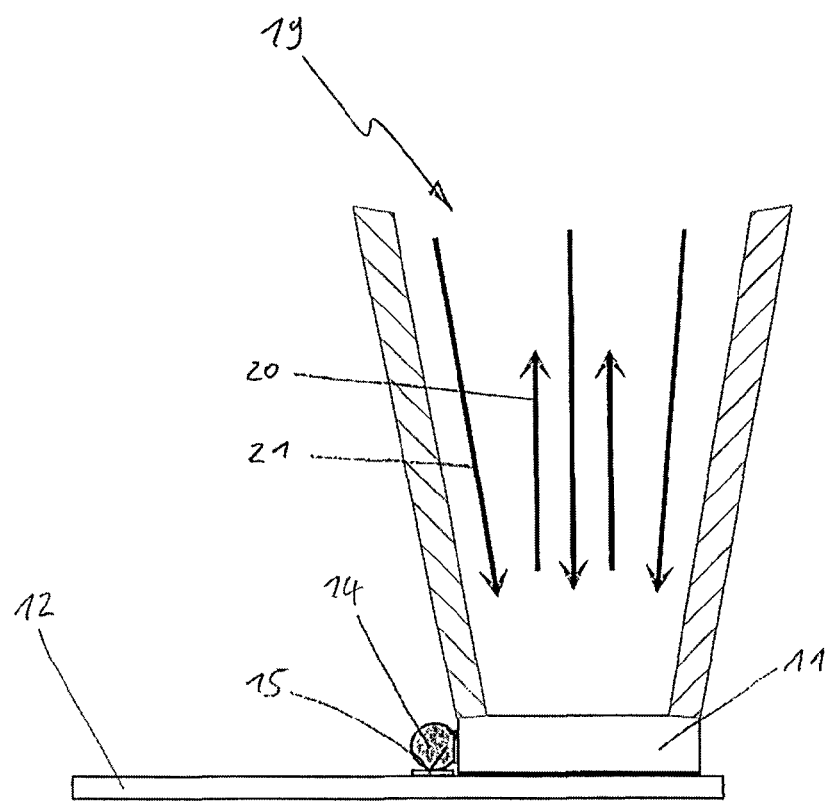
FIG. 2 shows the component and the carrier substrate with a contacting device in a first embodiment of the method.
Figure 4:
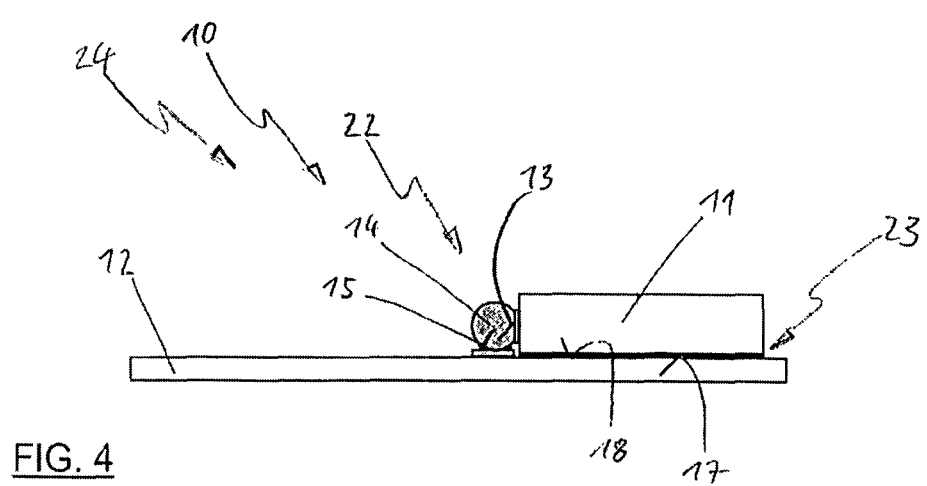
FIG. 4 shows the component and the carrier substrate after forming a contact arrangement.

A combined view in FIG. 1, FIG. 2 and FIG. 4 shows a sequence of process steps to form a contact arrangement 10 between a microelectronic component 11 and a carrier substrate 12. FIG. 1 shows the arrangement of the component 11 relative to the carrier substrate 12 immediately before forming a contact arrangement 10. On a terminal face 13 of the component 11, a molded piece of solder material designed as a solder bead 14 is contacted to the terminal face 13. The carrier substrate 12 has a terminal face 15 and an adhesive layer 16, the latter serving to form a mechanical connecting contact between the component 11 and the carrier substrate 12. The terminal face 13 is arranged at an angle relative to the terminal face 15, whereby a connecting surface 17 of the component 11 is arranged in parallel opposite a connecting surface 18 of the carrier substrate 12.

As shown in FIG. 2, the component 11 is secured on the contacting device 19 for handling by a contacting device 19, shown here schematically, by means of a vacuum, as illustrated by the arrows 20. In addition, the back of the component 11 is exposed to laser energy, represented here by the arrows 21 in a simplified form.

With the contacting of the connecting surfaces 17, 18 and the solder bead 14 with the terminal face 15, as illustrated in FIG. 2, heating of the component 11 and of the carrier substrate 12 takes place in such a way that the solder bead 14 is partially melted and the terminal face 15 is wetted with solder to form an electrically conducting connecting contact 22. At the same time, due to the heating of the adhesive layer 16, a mechanical connecting contact 23 is established between the component 11 and the carrier substrate 12.

The assembly unit 24 subsequently formed by curing of the adhesive layer 16 and solidification of the molten solder bead 14 in the contact arrangement 10 is shown in FIG. 4.

Figure 3:
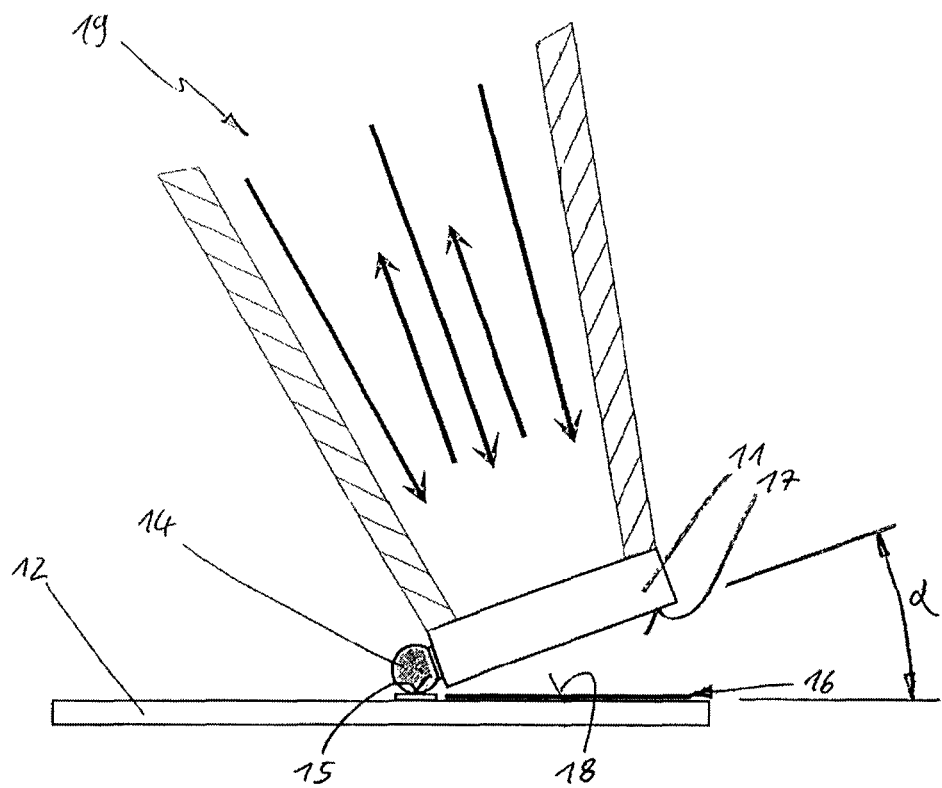
FIG. 3 shows the component and the carrier substrate with the contacting device in a second embodiment of the method.

A second embodiment of the method is shown in FIG. 3, where the solder bead 14 first comes into contact with the terminal face 15 of the carrier substrate 12. The component 11 is therefore pivoted about an angle α relative to the carrier substrate 12. After the solder bead 14 has melted and the terminal face 15 is wetted, the component 11 is pivoted about the angle α into a parallel position to the carrier substrate 12, so that the connecting surfaces 17 and 18 come to be in contact with the adhesive layer 16 in between. After curing of the adhesive layer 16 and solidification of the solder bead 14, the assembly unit 24 illustrated in FIG. 4 is formed.

Figure 5:
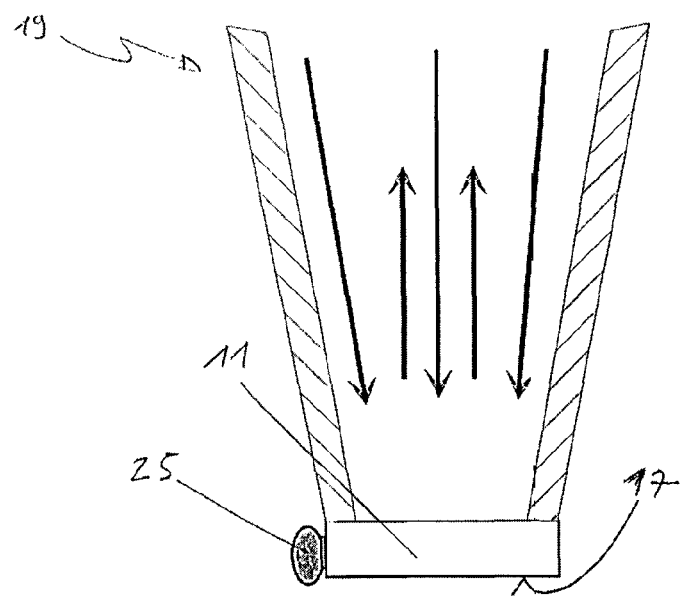
FIG. 5 shows the component and the carrier substrate with the contacting device in a third embodiment of the method.

FIG. 5 shows a third embodiment of the method in which, for a good connection with the carrier substrate, a solder bead 25 is mechanically deformed before being connected to the carrier substrate and has approximately the elliptical geometric structure shown in FIG. 5. The solder bead 25 protrudes beyond the connecting surface 17 of the component 11, so that before contacting the connecting surface 17 with an opposing connecting surface, the solder bead 25 is brought into contact with an opposing terminal face. After melting of the solder bead 25, the solder bead 25 is restored to a spherical shape due to the surface tension.

Figure 6:
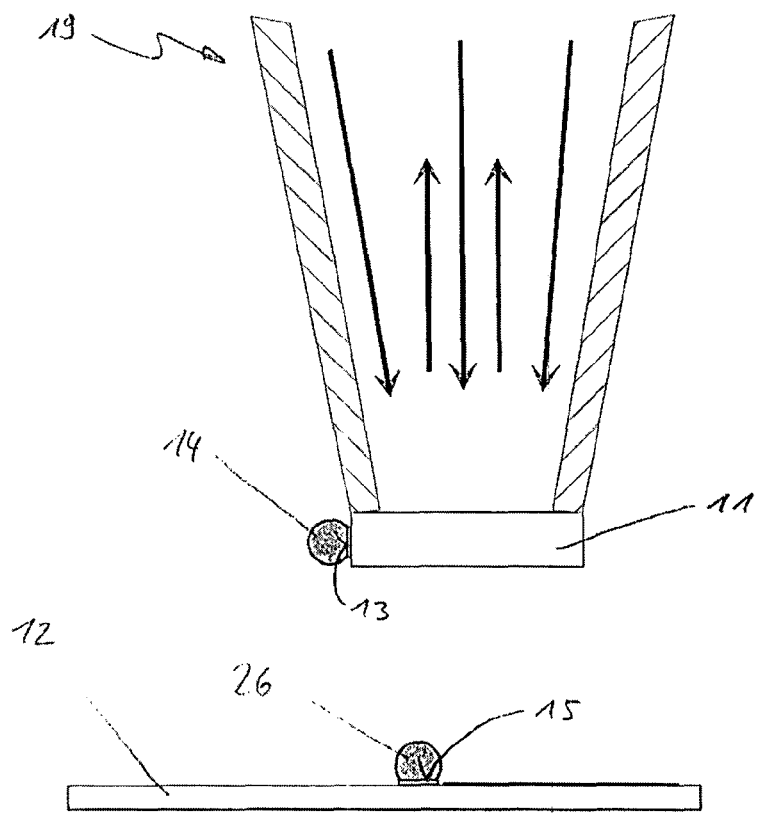
FIG. 6 shows the component and the carrier substrate with the contacting device in a fourth embodiment of the method.
Figure 7:
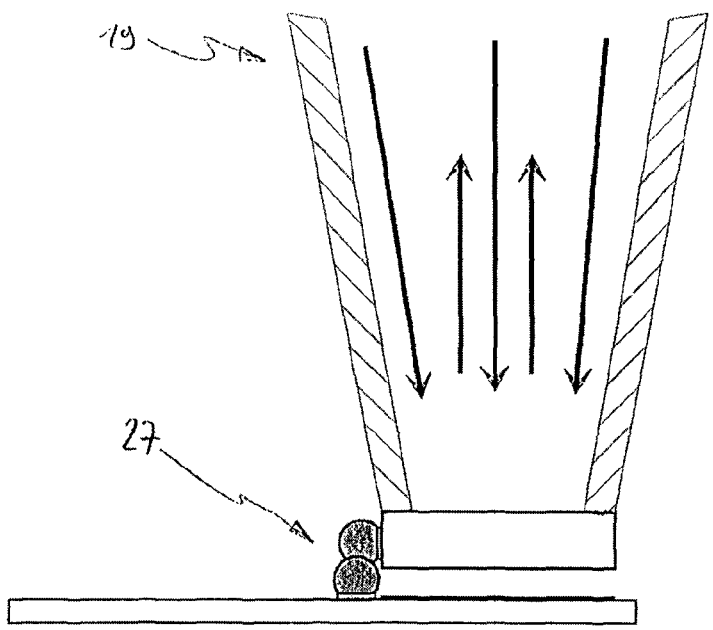
FIG. 7 shows the component and the carrier substrate with the contacting device in the fourth embodiment of the method during the first step.

FIG. 6 shows a fourth embodiment of the method, in which the terminal face 13 of the component 11 is provided with the solder bead 14, and the terminal face 15 of the carrier substrate 12 is provided with the solder bead 26. As FIG. 7 also shows, in an approach of the component 11 to the carrier substrate 12, the two solder beads 14 and 26 are brought in contact, whereby the two solder beads 14, 26 are fused to form a soldered connection 27 before a mechanical connecting contact is formed. The solder connection 27 can form a larger solder bead (not shown here) as the electric connecting contact.

Figure 8:
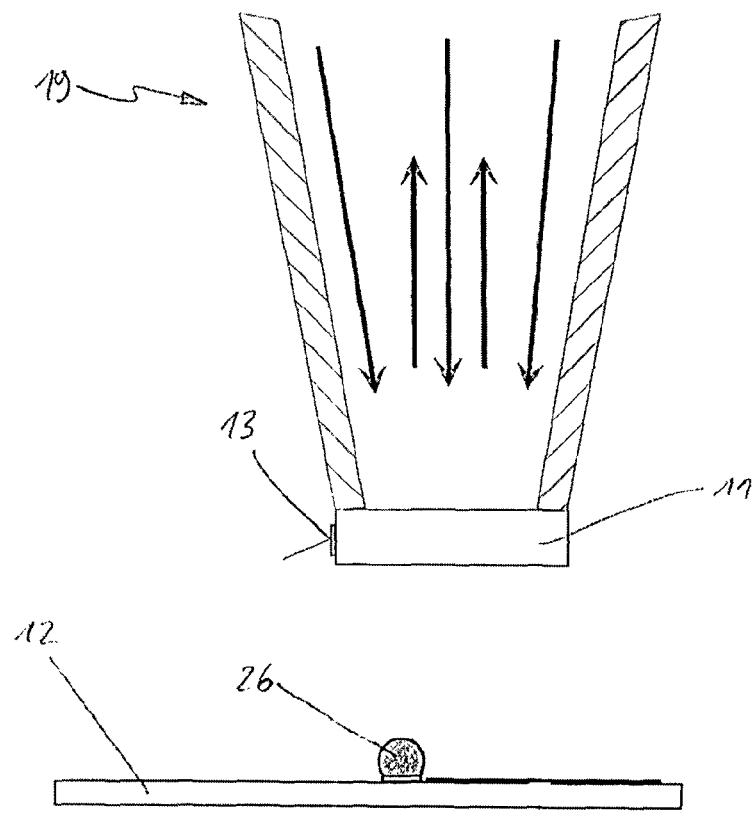
FIG. 8 shows the component and the carrier substrate with the contacting device in a fifth embodiment of the method.

FIG. 8 shows a fifth embodiment of the method in which the solder bead 26 is arranged on the terminal face 15 of the carrier substrate 12 and the component 11 is supplied for contacting with the terminal face 13 of the solder bead 26.

Figure 9:
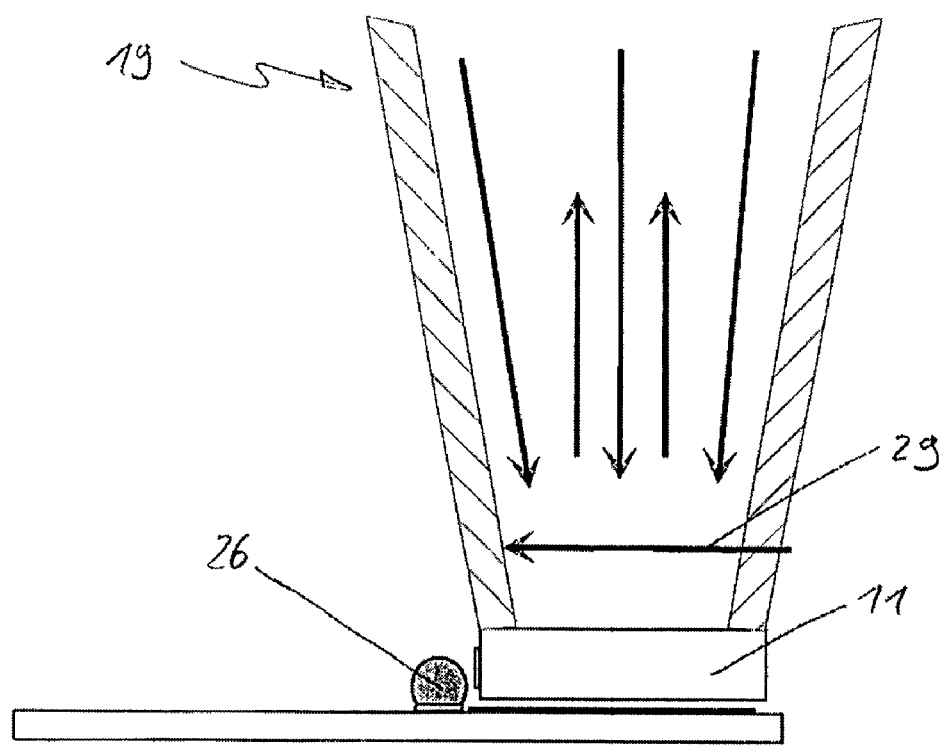
FIG. 9 shows the component and the carrier substrate with the contacting device in a sixth embodiment of the method.

FIG. 9 shows a sixth embodiment of the method in which the component 11 is moved in the direction of the solder bead 26 during contacting, as indicated by the arrow 29, to develop a good connection. The movement of the component 11 may be oscillating in one direction.

The invention claimed is:

1. A method for manufacturing a contact arrangement (10) between a microelectronic component and a carrier substrate by providing a thermal energy in connecting areas by exposing the back of the component to laser energy, a mechanical connecting contact is formed between opposing connecting surfaces of the component and the carrier substrate, and at least one electrically conducting connecting contact is formed between the terminal faces of the carrier substrate and the component by at least partial melting of solder material, wherein the terminal faces are arranged at an angle to one another, and the component and the carrier substrate are arranged at an angle (α) relative to one another in such a way that each terminal face is contacted with a molded piece of solder material and/or multiple molded pieces of solder material are contacted on each terminal face, and in a second step the connecting surfaces are then contacted by swiveling the component around the terminal face.

2. The method according to claim 1, wherein before the contact arrangement is formed, a molded piece of solder material is arranged on a terminal face.

3. The method according to claim 1, wherein before the contact arrangement is formed, a molded piece of solder materials arranged on the terminal face of the carrier substrate.

4. The method according to claim 1, wherein before the contact arrangement is formed, a molded piece of solder material is arranged on the terminal face of the component.

5. The method according to claim 4, wherein the molded piece of solder material is mechanically deformed.

6. The method according to claim 1; wherein the mechanical connecting contact and the electrically conducting connecting contact are formed in one step.

7. The method according to claim 3, wherein there is a relative movement between the component and the carrier substrate, such that the terminal face of the component is contacted with the molded piece of solder material and in a second step the connecting surfaces are contacted.

8. The method according to claim 1, wherein the mechanical connecting contact is formed by means of connecting material, which is applied to the component or to the carrier substrate.

9. The method according to claim 8, wherein adhesive material is used as the connecting material.

10. The method according to claim 8, wherein solder material is used as the connecting material.

* * * * *

UNITED STATES PATENT AND TRADEMARK OFFICE
CERTIFICATE OF CORRECTION

| | |
|---|---|
| PATENT NO. | : 8,087,163 B2 |
| APPLICATION NO. | : 12/092806 |
| DATED | : January 3, 2012 |
| INVENTOR(S) | : Ghassem Azdasht |

It is certified that error appears in the above-identified patent and that said Letters Patent is hereby corrected as shown below:

ON THE TITLE PAGE

Item (57) Abstract, line 12 "t" should be changed to -- at --

Signed and Sealed this
Tenth Day of April, 2012

David J. Kappos
*Director of the United States Patent and Trademark Office*